(12) United States Patent
Fujimoto et al.

(10) Patent No.: US 12,068,436 B2
(45) Date of Patent: Aug. 20, 2024

(54) LIGHT-EMITTING ELEMENT

(71) Applicant: NICHIA CORPORATION, Anan (JP)

(72) Inventors: Hiroshi Fujimoto, Anan (JP); Keiji Emura, Anan (JP); Hidetoshi Tanaka, Anan (JP)

(73) Assignee: NICHIA CORPORATION, Anan (JP)

( * ) Notice: Subject to any disclaimer, the term of this patent is extended or adjusted under 35 U.S.C. 154(b) by 439 days.

(21) Appl. No.: 17/479,957

(22) Filed: Sep. 20, 2021

(65) Prior Publication Data
US 2022/0102586 A1 Mar. 31, 2022

(30) Foreign Application Priority Data

Sep. 28, 2020 (JP) ................................. 2020-162020

(51) Int. Cl.
*H01L 33/38* (2010.01)
*H01L 33/62* (2010.01)

(52) U.S. Cl.
CPC ............ *H01L 33/382* (2013.01); *H01L 33/62* (2013.01)

(58) Field of Classification Search
CPC ......... H01L 33/06; H01L 33/08; H01L 33/24; H01L 33/32; H01L 33/38; H01L 33/382; H01L 33/62; H01L 33/20; H01L 33/0095; H01L 33/007; H01L 33/0075; H01L 33/04; H01L 33/145; H01L 33/405; H01L 33/44; H01L 33/42; H01L 33/22; H01L 33/14; H01L 21/268; H01L 2933/0025
USPC .... 257/79, 13, 77, 99, 98, 103, 96, 190, 76, 257/88, 94
See application file for complete search history.

(56) References Cited

U.S. PATENT DOCUMENTS

| | | |
|---|---|---|
| 2003/0057444 A1 | 3/2003 | Niki et al. |
| 2004/0012958 A1 | 1/2004 | Hashimoto et al. |
| 2012/0018766 A1* | 1/2012 | Emura .................... H01L 33/38 257/E33.066 |
| 2012/0199868 A1 | 8/2012 | Inoue et al. |

(Continued)

FOREIGN PATENT DOCUMENTS

| | | |
|---|---|---|
| JP | 2002-319704 A | 10/2002 |
| JP | 2002-319705 A | 10/2002 |
| JP | 2003-318441 A | 11/2003 |

(Continued)

*Primary Examiner* — Natalia A Gondarenko
(74) *Attorney, Agent, or Firm* — Foley & Lardner LLP

(57) ABSTRACT

A light-emitting element includes: a semiconductor stack having a triangular shape in a top plan view, the semiconductor stack including a first semiconductor layer, a second semiconductor layer, and an active layer between the first and seconds semiconductor layers; a first electrode located on the first semiconductor layer and including a first connecting portion and a first extension extending from the first connecting portion; and a second electrode located on the second semiconductor layer and including a second connecting portion and a second extension extending from the second connecting portion. The first extension includes a first portion extending from the first connecting portion toward the second connecting portion. The second extension includes a second portion including a portion extending along a first side, a third portion including a portion extending along a second side, and fourth and fifth portions each including a portion extending along a third side.

7 Claims, 5 Drawing Sheets

(56) References Cited

U.S. PATENT DOCUMENTS

2014/0175503 A1 6/2014 Hwang et al.
2016/0141454 A1 5/2016 Wang et al.

FOREIGN PATENT DOCUMENTS

| JP | 2012-164782 A | 8/2012 |
| JP | 2013-098211 A | 5/2013 |
| JP | 2014-068042 A | 4/2014 |

* cited by examiner

LIGHT-EMITTING ELEMENT

CROSS REFERENCE TO RELATED APPLICATION

This application claims priority to Japanese Patent Application No. 2020-162020, filed on Sep. 28, 2020, the disclosure of which is hereby incorporated by reference in their entirety.

BACKGROUND

1. Technical Field

The present disclosure relates to a light-emitting element.

2. Description of the Related Art

Japanese Patent Publication No. 2014-068042 discloses a semiconductor light-emitting element including a semiconductor layer portion on the primary surface of the substrate, wherein the semiconductor layer portion includes a light-emitting active structure and has a triangular shape in a top plan view. U.S. Patent Application Publication No. 2014/0175503 discloses a light-emitting element including a semiconductor layer having a triangular shape in a top plan view, and an electrode structure provided on the semiconductor layer and including a connecting portion and an extension.

SUMMARY

With the light-emitting element described above having a semiconductor layer portion having a triangular shape in a top plan view, it is desirable to reduce lopsided distribution of the current so as to improve emission distribution. An object of one embodiment of the present disclosure is to provide a light-emitting element with improved emission distribution.

A light-emitting element according to one embodiment of the present disclosure includes: a semiconductor stack having a triangular shape in a top plan view, the semiconductor stack including a first semiconductor layer of a first conductivity type, a second semiconductor layer of a second conductivity type, and an active layer located between the first semiconductor layer and the second semiconductor layer; a first electrode provided on the first semiconductor layer and including a first connecting portion and a first extension extending from the first connecting portion; and a second electrode provided on the second semiconductor layer and including a second connecting portion and a second extension extending from the second connecting portion, wherein: the semiconductor stack has a first side, a second side continuous with the first side, and a third side connecting the first side and the second side; the first extension includes a first portion extending from the first connecting portion toward the second connecting portion; and the second extension includes a second portion including a portion extending along the first side, a third portion including a portion extending along the second side, a fourth portion including a portion continuous with the second portion and extending along the third side, and a fifth portion including a portion continuous with the third portion and extending along the third side.

According to certain embodiments of the present disclosure, a light-emitting element with improved emission distribution can be provided.

DETAILED DESCRIPTION

First Embodiment

Figure 1:
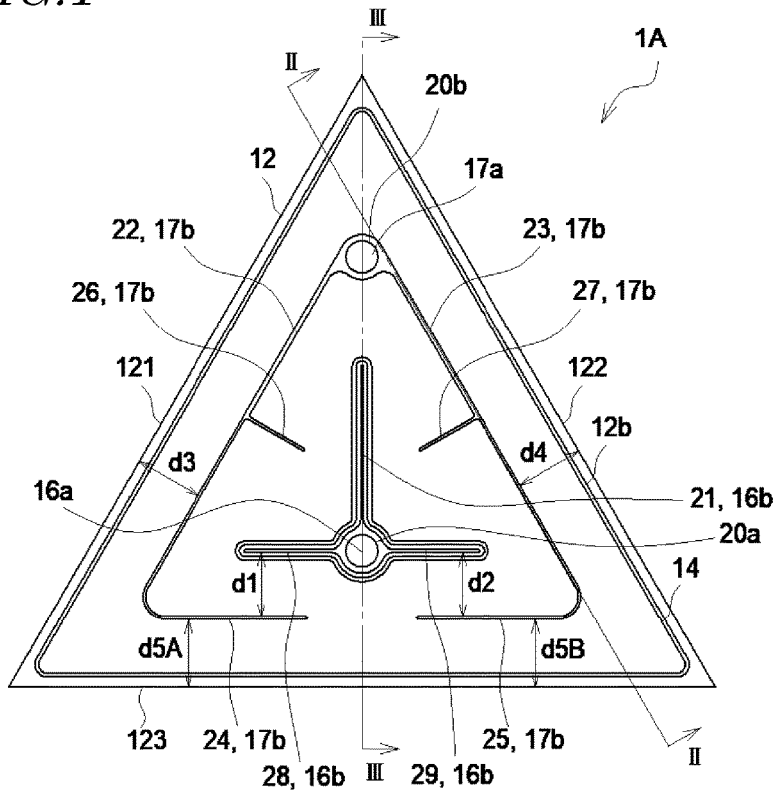
FIG. 1 is a top view schematically showing the configuration of a light-emitting element according to a first embodiment.

A light-emitting element according to a first embodiment will now be described in detail.

The drawings referred to in the following description are schematic representations of embodiments of the present invention. Scaling, spacing and positional relationship of and between different members may be exaggerated, or some of the members may be omitted. Scaling and spacing of and between different members may not be consistent between a top view and a cross-sectional view. In the following description, like nomenclatures and reference characters denote identical or like members, and the detailed explanation may be omitted as appropriate.

Terms such as "on", "upper", "above" and "below" as used herein indicate relative positions between components in drawings that are referred to for the purpose of explanation, and are not intended to indicate absolute positions unless specified otherwise.

The light-emitting element 1A according to the present embodiment includes a semiconductor stack 12 having a triangular shape in a top plan view, a first electrode 16 and a second electrode 17. The semiconductor stack 12 includes a first semiconductor layer 12a of the first conductivity type, a second semiconductor layer 12b of the second conductivity type, and an active layer 12c located between the first semiconductor layer 12a and the second semiconductor layer 12b. The first electrode 16 is provided on the first semiconductor layer 12a and includes a first connecting portion 16a and a first extension 16b extending from the first connecting portion 16a. The second electrode 17 is provided on the second semiconductor layer 12b and includes a second connecting portion 17a and a second extension 17b extending from the second connecting portion 17a. The semiconductor stack 12 has a first side 121, a second side 122 continuous with the first side 121, and a third side 123 connecting the first side 121 and the second side 122. The first extension 16*b* includes a first portion 21 extending from the first connecting portion 16*a* toward the second connecting portion 17*a*. The second extension 17*b* includes a second portion 22 that includes a portion extending along the first side 121, a third portion 23 that includes a portion extending along the second side 122, a fourth portion 24 that is continuous with the second portion 22 and includes a portion extending along the third side 123, and a fifth portion 25 that is continuous with the third portion 23 and includes a portion extending along the third side 123.

Figure 2:
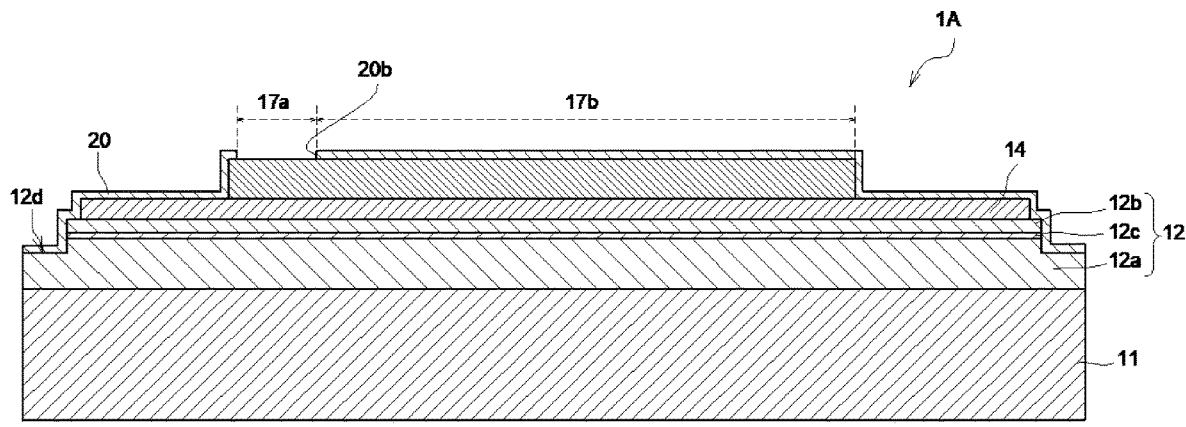
FIG. 2 is a schematic cross-sectional view taken along line II-II of FIG. 1.
Figure 3:
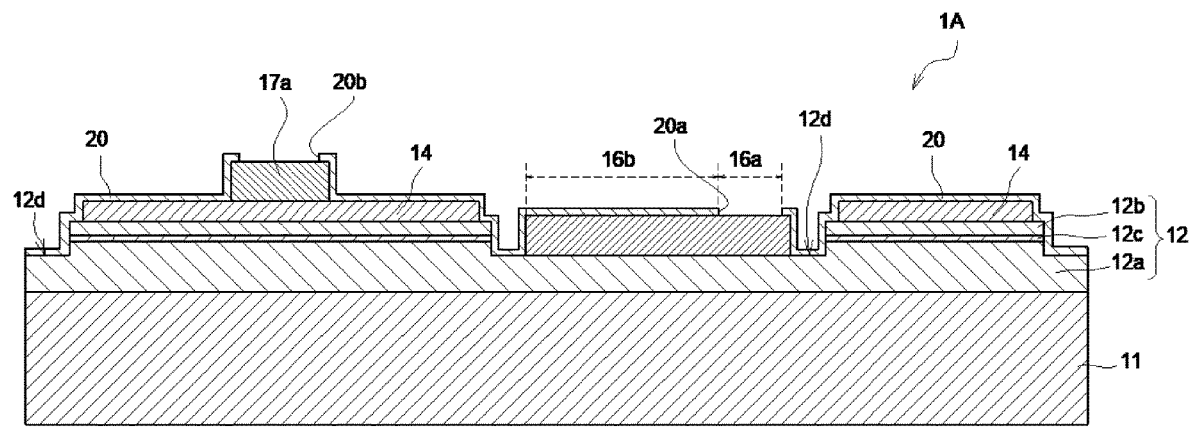
FIG. 3 is a schematic cross-sectional view taken along line of FIG. 1.

Referring to FIGS. 1 to 3, the light-emitting element LA of the present embodiment will be described in detail. FIG. 1 is a top view schematically showing the configuration of the light-emitting element 1A according to the first embodiment. FIG. 2 is a schematic cross-sectional view taken along line II-II of FIG. 1. FIG. 3 is a schematic cross-sectional view taken along line III-III of FIG. 1.

(Substrate)

A substrate 11 is for supporting the semiconductor stack 12. Alternatively, the substrate 11 may be a growth substrate for epitaxial growth of the semiconductor stack 12. The substrate 11 may be a sapphire ($Al_2O_3$) substrate, for example, when a nitride semiconductor is used for the semiconductor stack 12.

(Semiconductor Stack)

As shown in FIGS. 2 and 3, the semiconductor stack 12 is formed on the upper surface of the substrate 11. The semiconductor stack 12 includes the first semiconductor layer 12*a* of the first conductivity type, the second semiconductor layer 12*b* of the second conductivity type, and the active layer 12*c* located between the first semiconductor layer 12*a* and the second semiconductor layer 12*b*. The first conductivity type is the p type or the n type. The second conductivity type is a conductivity type different from the first conductivity type, and is the p type or the n type. In the present embodiment, the first conductivity type is the n-type and the second conductivity type is the p-type. The active layer 12*c* emits light by applying a voltage between the first electrode 16 provided on the first semiconductor layer 12*a* and the second electrode 17 provided on the second semiconductor layer 12*b*.

The semiconductor stack 12 includes a region where the second semiconductor layer 12*b* and the active layer 12*c* are partially absent, i.e., an exposed portion 12*d* in which the second semiconductor layer 12*b* and the active layer 12*c* are recessed from the surface of the second semiconductor layer 12*b* so that the first semiconductor layer 12*a* is exposed on the upper surface through the second semiconductor layer 12*b*.

As shown in FIG. 1, the semiconductor stack 12 includes the exposed portion 12*d* in an area surrounded by the second semiconductor layer 12*b* in a top plan view and in an area extending along the periphery of the light-emitting element 1A in a top plan view. The first electrode 16 is provided in the exposed portion 12*d* surrounded by the second semiconductor layer 12*b*, in a top plan view.

As shown in FIG. 1, the semiconductor stack 12 has a triangular shape in a top plan view. The semiconductor stack has the first side 121, the second side 122 that is continuous with the first side 121, and the third side 123 connecting the first side 121 and the second side 122. For example, the lengths of the first side 121, the second side 122 and the third side 123 can be made the same, in which case, the semiconductor stack 12 has a regular triangular shape in a top plan view. When the semiconductor stack 12 has a regular triangular shape in a top plan view, at least one corner may be rounded or one angle may be up to 60±5 degrees. For example, the lengths of the first side 121, the second side 122 and the third side 123 may be 600 µm or more and 1500 µm or less. The shape of the semiconductor stack 12 in a top plan view may be a triangular shape in which the first side 121, the second side 122 and the third side 123 have different lengths, or may be an isosceles triangular shape in which two of the first side 121, the second side 122 and the third side 123 have the same length. Note that the lengths of the first side 121, the second side 122 and the third side 123 being equal encompasses cases in which the length of one side is up to ±5% of the lengths of other sides.

The first semiconductor layer 12*a*, the second semiconductor layer 12*b* and the active layer 12*c* may be a nitride semiconductor such as $In_XAl_YGa_{1-X-Y}N$ ($0 \le X$, $0 \le Y$, $X+Y<1$), for example. For example, the semiconductor stack 12 is made of a nitride semiconductor. The peak emission wavelength of the active layer 12*c* is 430 nm or more and 600 nm or less, for example.

(First Electrode)

As shown in FIGS. 1 to 3, the first electrode 16 is provided on the first semiconductor layer 12*a*. The first electrode 16 includes the first connecting portion 16*a*, and the first extension 16*b* extending from the first connecting portion 16*a*. The first connecting portion 16*a* is an area for external connection by wire bonding, etc. The first electrode 16 is provided on a part of the exposed portion 12*d* of the first semiconductor layer 12*a*. As shown in FIG. 1, the first connecting portion 16*a* has a generally circular shape in a top plan view. The first extension 16*b* is an auxiliary electrode for efficiently diffusing the current supplied through the first connecting portion 16*a* to the first semiconductor layer 12*a*. In a top plan view, the width of the first extension 16*b* is narrower than that of the first connecting portion 16*a*. In a top plan view, the first electrode 16 is surrounded by the second electrode 17. The first connecting portion 16*a* and the second connecting portion 17*a* are provided so as to oppose each other and disposed on a virtual line that extends perpendicular to the third side 123.

The first extension 16*b* includes the first portion 21 that extends from the first connecting portion 16*a* toward the second connecting portion 17*a*. The first portion 21 includes a straight portion extending along a direction perpendicular to the third side 123. With the provision of the first portion 21, the current can be efficiently diffused between the first connecting portion 16*a* and the second connecting portion 17*a*.

The first extension 16*b* includes an eighth portion 28 extending from the first connecting portion 16*a* toward the second portion 22, and a ninth portion 29 extending from the first connecting portion 16*a* toward the third portion 23. With the provision of the eighth portion 28 and the ninth portion 29, the current can be efficiently diffused between the fourth portion 24 and the eighth portion 28 and between the fifth portion 25 and the ninth portion 29.

The eighth portion 28 and the ninth portion 29 of the first extension 16*b* each preferably include a portion extending along the third side 123. The eighth portion 28 and the ninth portion 29 each include a portion parallel to the third side 123, for example. The eighth portion 28 and the fourth portion 24 include portions parallel to each other. The ninth portion 29 and the fifth portion 25 include portions parallel to each other. Thus, the distance between the eighth portion 28 and the fourth portion 24 can easily be made more even, thereby improving the emission distribution in the area between the eighth portion 28 and the fourth portion 24. Similarly, because the distance between the ninth portion 29 and the fifth portion 25 can easily be made more even, it is possible to improve the emission distribution in the area between the ninth portion 29 and the fifth portion 25. As used herein, two portions being parallel is not limited to being strictly parallel but may include cases in which one portion is inclined by ±3 degrees relative to the other portion.

The first connecting portion 16a of the first electrode 16 may be Cu, Au, or an alloy including such a metal as its primary component, for example, so as to be suitable for external connection by wire bonding, etc. Note that the first connecting portion 16a and the first extension 16b of the first electrode 16 may be made of the same material.

(Second Electrode)

As shown in FIGS. 1 to 3, the second electrode 17 is provided on the second semiconductor layer 12b. The second electrode 17 includes the second connecting portion 17a, and the second extension 17b extending from the second connecting portion 17a. The second connecting portion 17a is an area for external connection by wire bonding, etc. The second connecting portion 17a has a generally circular shape in a top plan view. With the provision of the second extension 17b, the current supplied through the second connecting portion 17a can be efficiently diffused to the second semiconductor layer 12b through a light-transmissive conductive layer 14. In a top plan view, the width of the second extension 17b is narrower than the width of the second connecting portion 17a.

The second extension 17b includes the second portion 22 that includes a portion extending along the first side 121, the third portion 23 that includes a portion extending along the second side 122, the fourth portion 24 that is continuous with the second portion 22 and includes a portion extending along the third side 123, and the fifth portion 25 that is continuously with the third portion 23 and includes a portion extending along the third side 123. The second portion 22 includes a straight portion parallel to the first side 121, for example. The third portion 23 includes a straight portion parallel to the second side 122, for example. The fourth portion 24 and the fifth portion 25 include straight portions parallel to the third side 123, for example. The second extension 17b includes portions extending along the first side 121, the second side 122 and the third side 123, respectively. With the provision of the second portion 22, the third portion 23, the fourth portion 24 and the fifth portion 25 as described above, it is possible to diffuse the current to the area between the outer periphery of the second semiconductor layer 12b and the second portion 22, the third portion 23, the fourth portion 24 and the fifth portion 25, thereby improving the emission distribution. The distance d3 between the first side 121 and the second portion 22, the distance d4 between the second side 122 and the third portion 23, the distance d5A between the third side 123 and the fourth portion 24 and the distance d5B between the third side 123 and the fifth portion 25 can be set to 80 μm or more and 120 μm or less, for example. In order to reduce the lopsided distribution of the current, the distance d3, the distance d4, the distance d5A and the distance d5B are preferably an equal. The distance d5A, between the third side 123 and the fourth portion 24 may be made shorter than the distance d1. The distance d5B between the third side 123 and the fifth portion 25 may be made shorter than the distance d2. Note that the distance d3, the distance d4, the distance d5A and the distance d5B being equal encompasses cases in which the length of one side is ±5% of the lengths of the other sides.

The second extension 17b preferably includes a sixth portion 26 that extends from the second portion 22 toward the first electrode 16, and a seventh portion 27 that extends from the third portion 23 toward the first electrode 16. For example, the second extension 17b preferably includes the sixth portion 26 that extends from the second portion 22 toward the first portion 21 and extends perpendicular to the first side 121, and the seventh portion 27 that extends from the third portion 23 toward the first portion 21 and extends perpendicular to the second side 122. This allows for reducing the area where the distance between the second extension 17b and the first portion 21 is large, and reducing the lopsided distribution of the current. The sixth portion 26 is provided at a position half the length of the second portion 22 in the direction of extension. The seventh portion 27 is provided at a position half the length of the third portion 23 in the direction of extension.

The width of a portion of the second portion 22 that is located on the fourth portion 24 side is preferably smaller than the width of another portion of the second portion 22 that is located on the second connecting portion 17a side. For example, the width of a portion of the second portion 22 that is located on the side of the fourth portion 24 with respect to the position at which the sixth portion 26 is provided is smaller than another portion of the second portion 22 that is located on the side of the second connecting portion 17a with respect to the position at which the sixth portion 26 is provided. Thus, the current can be diffused to a portion of the second portion 22 that is away from the second connecting portion 17a, and it is possible to reduce the lopsided distribution of the current and improve the emission distribution. The width of the fourth portion 24 is equal to the width of a portion of the second portion 22 that is located on the side of the fourth portion 24 with respect to the position at which the sixth portion 26 is provided. The width of a portion of the third portion 23 that is located on the fifth portion 25 side is preferably smaller than the width of a portion of the third portion 23 that is located on the second connecting portion 17a side. For example, the width of a portion of the third portion 23 that is located on the side of the fifth portion 25 with respect to the position at which the seventh portion 27 is provided is smaller than the width of another portion of the third portion 23 that is located on the side of the second connecting portion 17a with respect to the position at which the seventh portion 27 is provided. Thus, the current can be diffused to a portion of the third portion 23 that is away from the second connecting portion 17a, and it is possible to reduce the lopsided distribution of the current and improve the emission distribution. The width of the fifth portion 25 is equal to the width of a portion of the third portion 23 that is located on the side of the fifth portion 25 with respect to the position at which the seventh portion 27 is provided.

The fourth portion 24 and the fifth portion 25 are provided at positions closer to the third side 123 than the eighth portion 28 and the ninth portion 29. The fourth portion 24 and the eighth portion 28 include portions parallel to each other. The fifth portion 25 and the ninth portion 29 include portions parallel to each other. With such an arrangement, it is possible to improve the emission distribution in the area between the fourth portion 24 and the eighth portion 28 and the area between the fifth portion 25 and the ninth portion 29.

The second connecting portion 17a and the second extension 17b of the second electrode 17 may be made of the same material. The second electrode 17 may be Cu, Au, or an alloy including such a metal as its primary component, for example, so as to be suitable for external connection by wire bonding, etc.

(Light-Transmissive Conductive Layer)

As shown in FIGS. 1 to 3, the light-transmissive conductive layer 14 is provided between the second electrode and the second semiconductor layer 12b. The light-transmissive conductive layer 14 is electrically connected to the second semiconductor layer 12b. As the light-transmissive conductive layer 14 is provided to cover substantially the entire upper surface of the second semiconductor layer 12b, the current supplied to the second electrode 17 can be diffused over a wider area of the second semiconductor layer 12b.

The light-transmissive conductive layer 14 is preferably made of a metal oxide that is electrically conductive. The light-transmissive conductive layer 14 is, for example, an oxide containing at least one element selected from the group consisting of Zn, In, Sn, Ga and Ti. For example, the light-transmissive conductive layer 14 may be ITO or ZnO. ITO and ZnO are suitable materials for covering substantially the entire upper surface of the second semiconductor layer 12b as they have a high light transmission to visible light and a high electrical conductivity.

The thickness of the light-transmissive conductive layer 14 is preferably made thinner in order to suppress light absorption by the light-transmissive conductive layer 14. For example, the thickness of the light-transmissive conductive layer 14 may be 30 nm or more and 100 nm or less, and preferably 35 nm or more and 80 nm or less.

(Protective Film)

A protective film 20 covers substantially the entire upper surface side of the light-emitting element LA. As shown in FIGS. 2 and 3, the protective film 20 has a first opening 20a, through which the first connecting portion 16a of the first electrode 16 is exposed. The area in which the first opening 20a is provided corresponds to the area of the first connecting portion 16a. The protective film 20 has a second opening 20b, through which the second connecting portion 17a of the second electrode 17 is exposed. The area in which the second opening 20b is provided corresponds to the area of the second connecting portion 17a. The protective film 20 does not cover the first connecting portion 16a and the second connecting portion 17a, and covers the first extension 16b and the second extension 17b. The protective film 20 preferably uses a material that is light-transmissive and electrically insulative. For example, $SiO_2$ and SiON may be used for the protective film 20.

As described above, according to the present embodiment, by forming the first electrode 16 including the first extension 16b and the second electrode 17 including the second extension 17b in the semiconductor stack 12 having a triangular shape in a top plan view, the current can be efficiently diffused to the semiconductor stack 12 over a wide area. Therefore, it is possible to provide a light-emitting element with which the lopsided distribution of the current in the semiconductor stack 12 is reduced and the emission distribution is improved.

Second Embodiment

Figure 4:
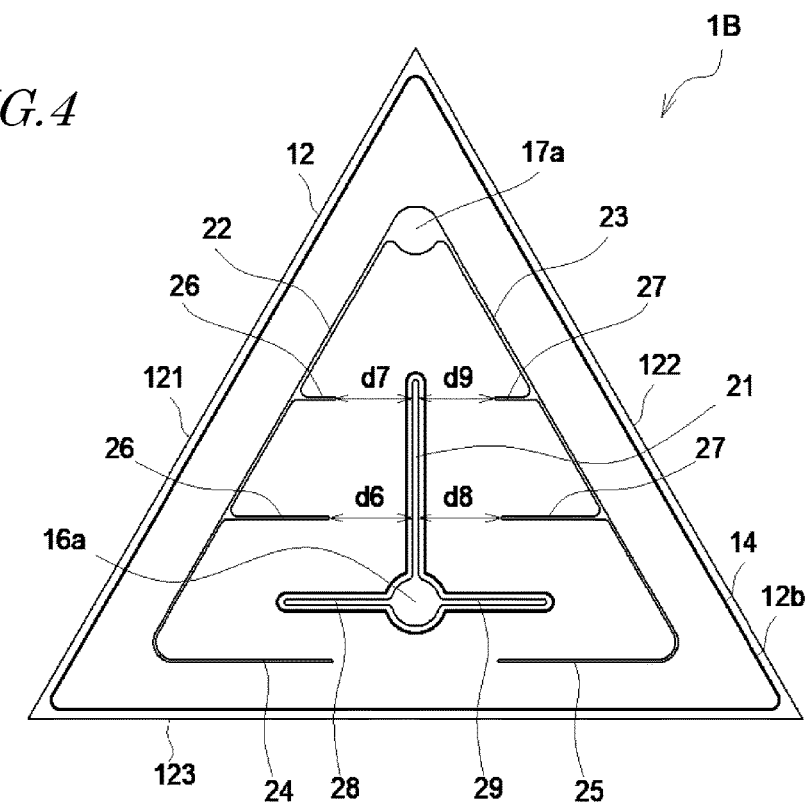
FIG. 4 is a top view schematically showing the configuration of a light-emitting element according to a second embodiment.

Referring to FIG. 4, a light-emitting element 13 according to a second embodiment will be described. The present embodiment is different from the first embodiment primarily in terms of the arrangement of the sixth portion 26 and the seventh portion 27.

In the present embodiment, as shown in FIG. 4, the second extension 17b includes the sixth portion 26 that extends from the second portion 22 toward the first portion 21 and includes a portion extending along the third side 123, and the seventh portion 27 that extends from the third portion 23 toward the first portion 21 and includes a portion extending along the third side 123. The sixth portion 26 and the seventh portion 27 include portions parallel to the third side 123.

As shown in FIG. 4, in the present embodiment, there are two sixth portions 26 having different lengths and two seventh portions 27 having different lengths. The length of one of the two sixth portions 26 that is located closer to the second connecting portion 17a is shorter than the length of another one of the two sixth portions 26 that is located closer to the first connecting portion 16a. The length of one of the two seventh portions 27 that is located closer to the second connecting portion 17a is shorter than another one of the two seventh portions 27 that is located closer to the first connecting portion 16a. Thus, as compared with a case in which the sixth portions 26 have an equal length, it is possible to efficiently diffuse the current between the second portion 22 and the first portion 21, and improve the emission distribution. Moreover, as compared with a case in which the two seventh portions 27 have an equal length, it is possible to efficiently diffuse the current between the third portion and the first portion 21, and improve the emission distribution.

In the direction parallel to the third side 123, the distance d6 between the first portion 21 and the sixth portion 26 located closer to the first connecting portion 16a is equal to the distance d7 between the first portion 21 and the sixth portion 26 located closer to the second connecting portion 17a. In the direction parallel to the third side 123, the distance d8 between the first portion 21 and the seventh portion 27 located closer to the first connecting portion 16a is equal to the distance d9 between the first portion 21 and the seventh portion 27 located closer to the second connecting portion 17a. With such an arrangement, it is possible to improve the emission distribution in the area between the first portion 21 and the two sixth portions 26 and in the area between the first portion 21 and the two seventh portions 27. The distance between the first portion 21 and the sixth portion 26 as used herein refers to the shortest distance between the first portion 21 and the sixth portion 26. Similarly, the distance between the first portion 21 and the seventh portion 27 refers to the shortest distance between the first portion 21 and the seventh portion 27.

The fourth portion 24, the sixth portion 26 and the eighth portion 28 include portions parallel to each other. With such an arrangement, it is possible to improve the emission distribution in the area between the fourth portion 24 and the eighth portion 28 and in the area between the sixth portion 26 and the eighth portion 28. The fifth portion 25, the seventh portion 27 and the ninth portion 29 include portions parallel to each other. With such an arrangement, it is possible to improve the emission distribution in the area between the fifth portion 25 and the ninth portion 29 and in the area between the seventh portion 27 and the ninth portion 29.

The width of a portion of the second portion 22 that extends between one sixth portion 26 that is located closer to the first connecting portion 16a and the fourth portion 24 is smaller than the width of a portion of the second portion 22 that extends between the position at which one sixth portion 26 that is located closer to the first connecting portion 16a is provided and the position at which one sixth portion 26 that is located closer to the second connecting portion 17a is provided. The width of a portion of the second portion 22 that extends between the position at which one sixth portion 26 that is located closer to the first connecting portion 16a is provided and the position at which one sixth portion 26 that is located closer to the second connecting portion 17a is provided is smaller than the width of a portion of the second portion 22 that extends between the second connecting portion 17a and the position at which one sixth portion 26 that is located closer to the second connecting portion 17a is provided. That is, the second portion 22 has three different widths. Thus, the current can be diffused to a portion of the second portion 22 that is away from the second connecting portion 17a, and it is possible to reduce the lopsided distribution of the current and improve the emission distribution. The width of the fourth portion 24 is equal to the width of a portion of the second portion 22 that extends between one sixth portion 26 that is located closer to the first connecting portion 16a and the fourth portion 24. The width of a portion of the third portion 23 that extends between one seventh portion 27 that is located closer to the first connecting portion 16a and the fifth portion 25 is smaller than the width of a portion of the third portion 23 that extends between the position at which one seventh portion 27 that is located closer to the first connecting portion 16a is provided and the position at which the seventh portion 27 that is located closer to the second connecting portion 17a is provided. The width of a portion of the third portion 23 that extends between the position at which one seventh portion 27 that is located closer to the first connecting portion 16a is provided and the position at which one seventh portion 27 that is closer to the second connecting portion 17a is provided is smaller than the width of a portion of the third portion 23 that extends between the second connecting portion 17a and the position at which one seventh portion 27 that is located closer to the second connecting portion 17a is provided. That is, the third portion 23 has three different widths. Thus, the current can be diffused to a portion of the third portion 23 that is away from the second connecting portion 17a, and it is possible to reduce the lopsided distribution of the current and improve the emission distribution. The width of the fifth portion 25 is equal to the width of a portion of the third portion 23 that extends between one seventh portion 27 that is located closer to the first connecting portion 16a and the fifth portion 25.

Third Embodiment

Figure 5:
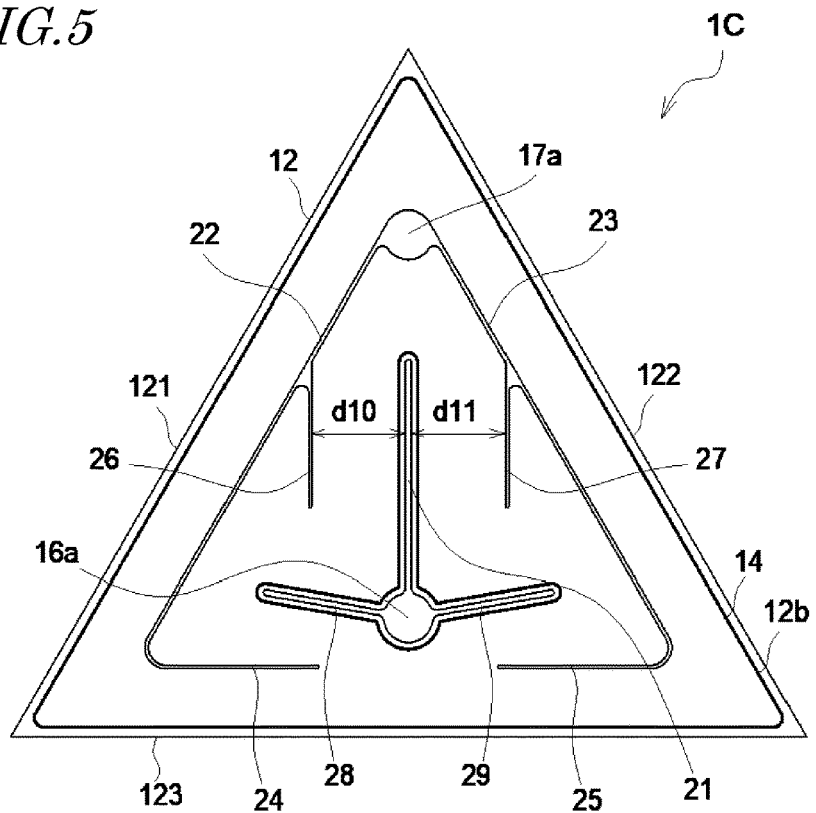
FIG. 5 is a top view schematically showing the configuration of a light-emitting element according to a third embodiment.

Referring to FIG. 5, a light-emitting element 1C according to a third embodiment will be described. The present embodiment is different from the first embodiment primarily in terms of the arrangement of the first connecting portion 16a, the sixth portion 26, the seventh portion 27, the eighth portion 28 and the ninth portion 29.

As shown in FIG. 5, the second extension 17b includes the sixth portion 26 that extends from the second portion 22 toward the third side 123 and includes a portion extending perpendicular to the third side 123, and the seventh portion 27 that extends from the third portion 23 toward the third side 123 and includes a portion extending perpendicular to the third side 123. The first portion 21 and the sixth portion 26 include portions parallel to each other. The first portion 21 and the seventh portion 27 include portions parallel to each other. With such an arrangement, it is easy to increase the area where the distance d10 between the first portion 21 and the sixth portion 26 is constant. It is also easy to increase the area where the distance d11 between the first portion 21 and the seventh portion 27 is constant. Thus, it is possible to improve the emission distribution in the area between the first portion 21 and the sixth portion 26 and in the area between the first portion 21 and the seventh portion 27. In the present embodiment, the length of the sixth portion 26 is equal to the length of the seventh portion 27.

The eighth portion 28 and the ninth portion 29 each include a portion inclined relative to the third side 123. For example, the distance in the direction perpendicular to the third side 123 between the fourth portion 24 and the eighth portion 28 gradually increases from the first connecting portion 16a toward the first side 121. For example, the distance in the direction perpendicular to the third side 123 between the fifth portion 25 and the ninth portion 29 gradually increases from the first connecting portion 16a toward the second side 122. With such an arrangement, even when the first connecting portion 16a is moved closer to the third side 123 as compared with the first embodiment, for example, the distance between the fourth portion 24 and the eighth portion 28 or the distance between the fifth portion 25 and the ninth portion 29 is not likely to be locally narrowed, and it is possible to suppress deterioration of the emission distribution. With the first connecting portion 16a moved closer to the third side 123, when a wire is connected to the first connecting portion 16a from outside, it is possible to reduce the area of the wire disposed above the semiconductor stack 12. Thus, it is possible to reduce light absorption by the wire and improve the light extraction efficiency.

Fourth Embodiment

Figure 6:
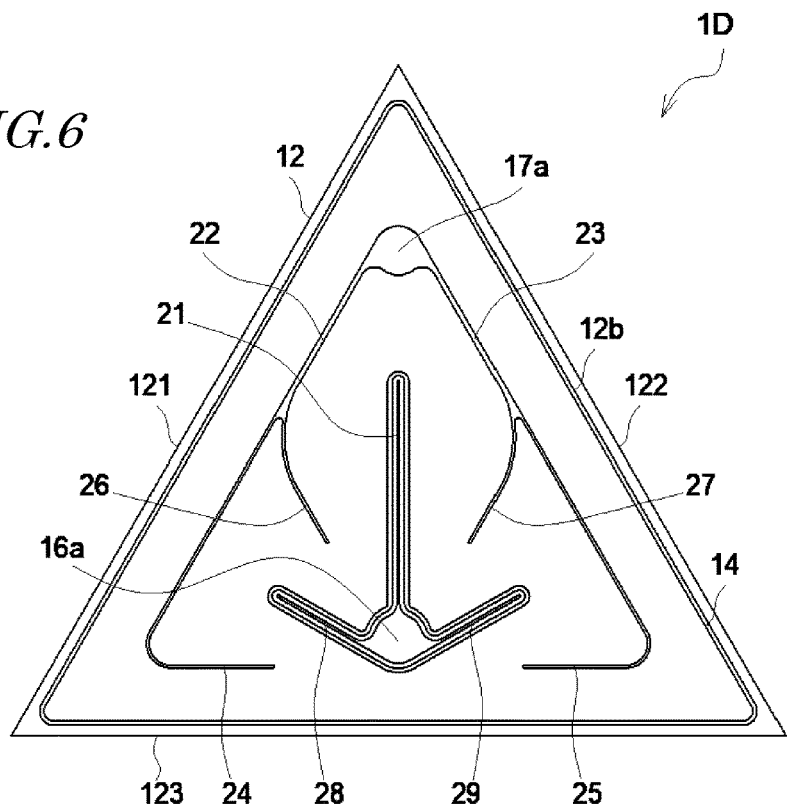
FIG. 6 is a top view schematically showing the configuration of a light-emitting element according to a fourth embodiment.

Referring to FIG. 6, a light-emitting element 1D according to a fourth embodiment will be described. The present embodiment is different from the first embodiment primarily in terms of the arrangement of the first connecting portion 16a, the sixth portion 26, the seventh portion 27, the eighth portion 28 and the ninth portion 29.

As shown in FIG. 6, in the present embodiment, the sixth portion 26 and the seventh portion 27 each include a curved portion. For example, the sixth portion 26 extends from the second portion 22 while being curved toward the first connecting portion 16a. For example, the seventh portion 27 extends from the third portion 23 while being curved toward the first connecting portion 16a.

The eighth portion 28 and the ninth portion 29 each include a portion inclined relative to the third side 123, as in the third embodiment described above. For example, the distance in the direction perpendicular to the third side 123 between the third side 123 and the eighth portion 28 gradually increases from the first connecting portion 16a toward the first side 121. For example, the distance in the direction perpendicular to the third side 123 between the third side 123 and the ninth portion 29 gradually increases from the first connecting portion 16a toward the second side 122. With such an arrangement, even when the first connecting portion 16a is moved closer to the third side 123 as compared with the first embodiment, for example, the distance between the fourth portion 24 and the eighth portion 28 or the distance between the fifth portion 25 and the ninth portion 29 is not likely to be locally narrowed, and it is possible to suppress deterioration of the emission distribution. In the present embodiment, a part of the exposed portion 12d is located between the fourth portion 24 and the fifth portion 25, and the first electrode 16 is provided in the exposed portion 12d. With the first connecting portion 16a moved closer to the third side 123, when a wire is connected to the first connecting portion 16a from outside, it is possible to reduce the area of the wire disposed above the semiconductor stack 12. Thus, it is possible to reduce light absorption by the wire and improve the light extraction efficiency.

Fifth Embodiment

Figure 7:
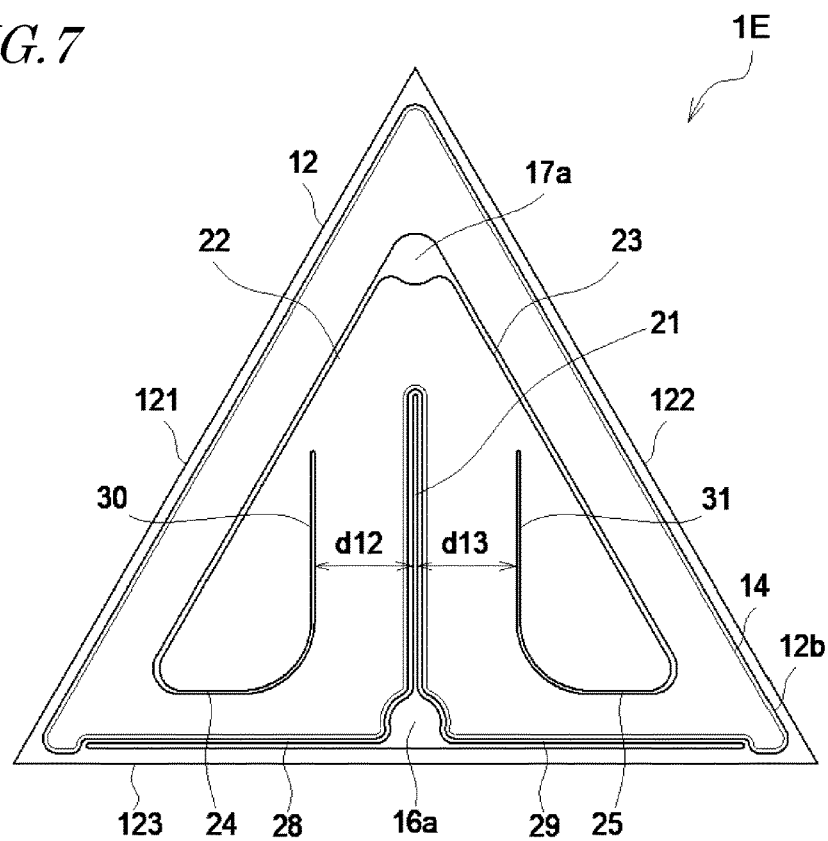
FIG. 7 is a top view schematically showing the configuration of a light-emitting element according to a fifth embodiment.

Referring to FIG. 7, a light-emitting element 1E according to a fifth embodiment will be described. The present embodiment is different from the first embodiment primarily in terms of the arrangement of the first extension 16b and the second extension 17b.

As shown in FIG. 7, in the present embodiment, the eighth portion 28 is provided between the fourth portion 24 and the third side 123. The ninth portion 29 is provided between the fifth portion 25 and the third side 123. The eighth portion 28 and the ninth portion 29 are provided extending along the outer periphery of the second semiconductor layer 12b.

The second extension 17b includes a tenth portion 30 that extends from the fourth portion 24 toward the second portion 22 and includes a portion extending perpendicular to the third side 123, and an eleventh portion 31 that extends from the fifth portion 25 toward the third portion 23 and includes a portion extending perpendicular to the third side 123. The tenth portion 30 and an eleventh portion 31 include portions parallel to the first portion 21 and to each other. With such an arrangement, it is easy to increase the area where the distance d12 between the first portion 21 and the tenth portion 30 is constant. With such an arrangement, it is also easy to increase the area where the distance d13 between the first portion 21 and an eleventh portion 31 is constant. Thus, it is possible to improve the emission distribution in the area between the tenth portion 30 and the first portion 21 and in the area between an eleventh portion 31 and the first portion 21.

Figure 8:
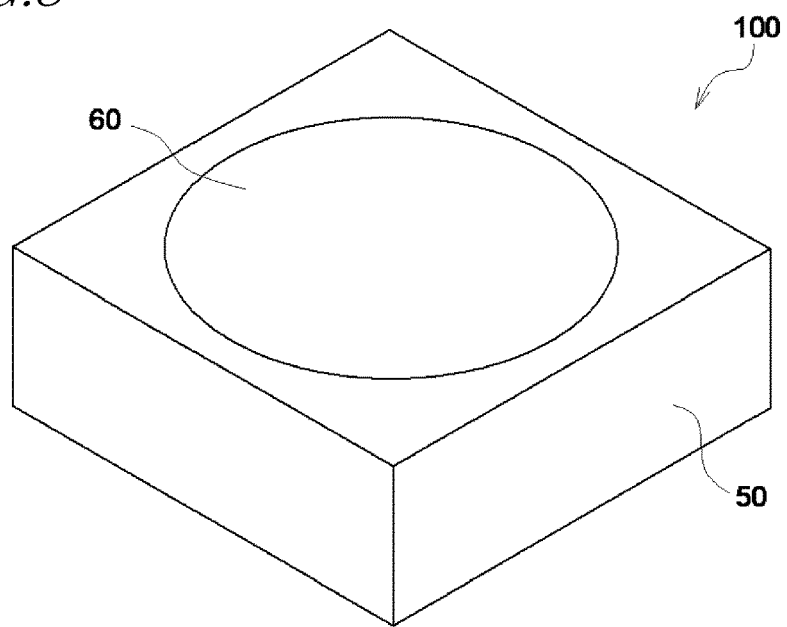
FIG. 8 is a perspective view schematically showing a light-emitting device using a light-emitting element according to one embodiment of the present invention.
Figure 9:
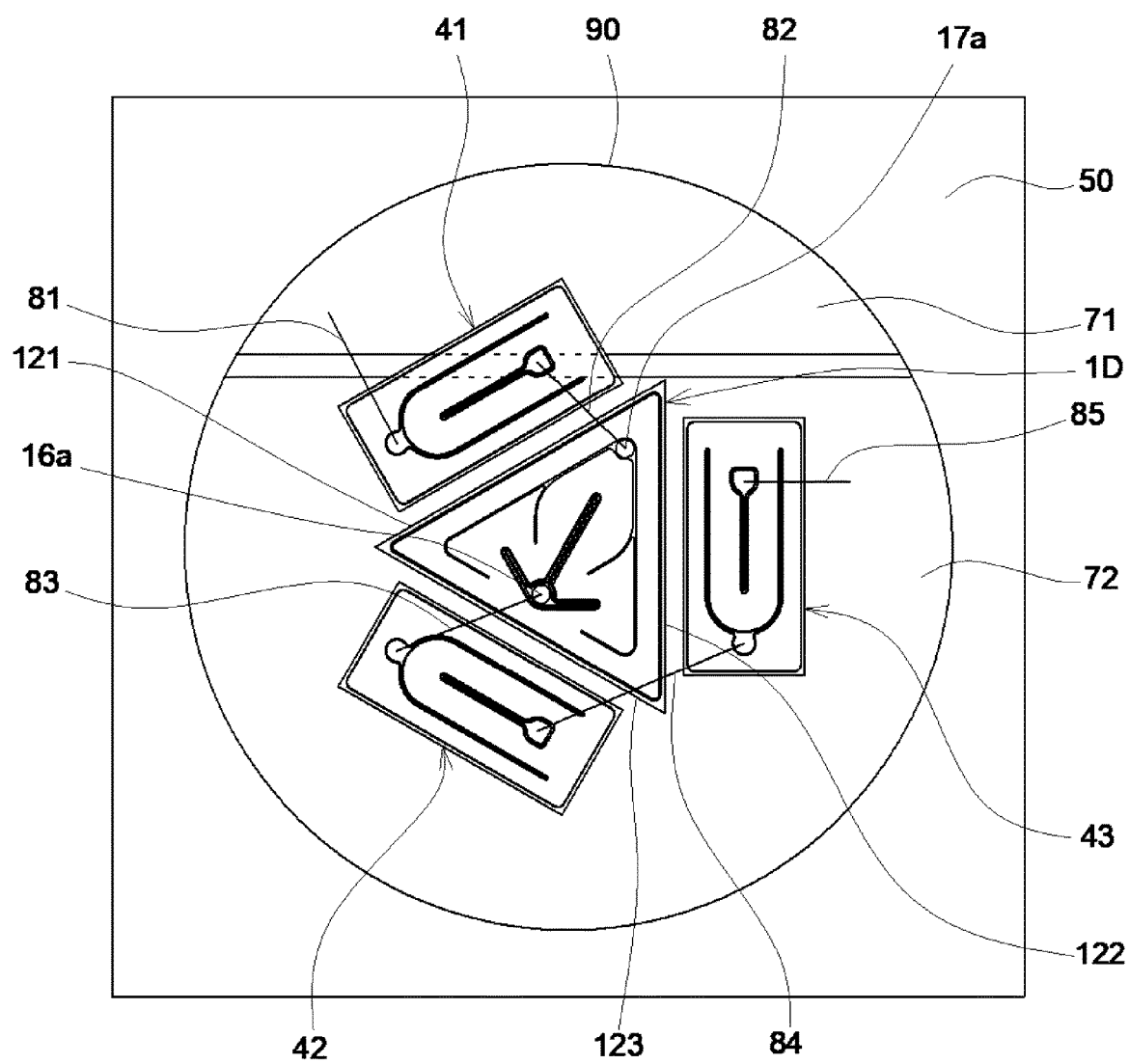
FIG. 9 is a schematic top view illustrating the configuration of a light-emitting device using a light-emitting element according to one embodiment of the present invention.

Referring next to FIGS. 8 and 9, the configuration of a light-emitting device 100 using the light-emitting element 1D according to an embodiment of the present invention will be described. The light-emitting device 100 includes the light-emitting element 1D, a first light-emitting element 41, a second light-emitting element 42, a third light-emitting element 43, a resin portion 50 and an encapsulant 60. The resin portion 50 has a recessed portion 90, and a first wiring 71 of the first conductivity type and a second wiring 72 of the second conductivity type are provided on the bottom surface of the recessed portion 90. An encapsulant 60 is provided in the recessed portion 90 of the resin portion 50.

As shown in FIG. 9, the light-emitting element 1D, the first light-emitting element 41, the second light-emitting element 42 and the third light-emitting element 43 are provided in the recessed portion 90 of the resin portion 50. The first light-emitting element 41, the second light-emitting element and the third light-emitting element 43 each have a rectangular shape with long and short sides in a top plan view. The first light-emitting element 41, the second light-emitting element 42 and the third light-emitting element 43 are disposed so as to surround the light-emitting element 1D. Specifically, the long side of the first light-emitting element 41 opposes the first side 121 of the light-emitting element 1D, the long side of the second light-emitting element 42 opposes the third side 123 of the light-emitting element 1D, and the long side of the third light-emitting element 43 opposes the second side 122 of the light-emitting element 1D. With such an arrangement, when the emission color of the light-emitting element 1D is different from the emission color of the first light-emitting element 41, the second light-emitting element 42 and the third light-emitting element 43, for example, the color-mixing property of the light-emitting device can be improved. The length of one side of the light-emitting element 1D is longer than the long side of the first light-emitting element 41, the second light-emitting element 42 and the third light-emitting element 43.

The light-emitting element 1D, the first light-emitting element 41, the second light-emitting element 42 and the third light-emitting element 43 are electrically connected to the first wiring 71 and the second wiring 72 by a plurality of wires. The light-emitting element 1D, the first light-emitting element 41, the second light-emitting element 42 and the third light-emitting element 43 are connected in series by a plurality of wires. Specifically, an electrode of the second conductivity type of the first light-emitting element 41 is electrically connected to the first wiring 71 by a first wire 81. An electrode of the first conductivity type of the first light-emitting element 41 is electrically connected to the second connecting portion 17a of the light-emitting element 1D by a second wire 82. The first connecting portion 16a of the light-emitting element 1D is electrically connected to an electrode of the second conductivity type of the second light-emitting element 42 by a third wire 83. An electrode of the first conductivity type of the second light-emitting element 42 is electrically connected to an electrode of the second conductivity type of the third light-emitting element 43 by a fourth wire 84. An electrode of the first conductivity type of the third light-emitting element 43 is electrically connected to the second wiring 72 by a fifth wire 85.

The peak emission wavelength of the light-emitting element 1D is 500 nm or more and 570 nm or less. The light-emitting element 1D emits green light, for example. The peak emission wavelengths of the first light-emitting element 41, the second light-emitting element 42 and the third light-emitting element 43 are 430 nm or more and 470 nm or less. The first light-emitting element 41, the second light-emitting element 42 and the third light-emitting element 43 emit blue light, for example. Because the first light-emitting element 41, the second light-emitting element 42 and the third light-emitting element 43, which emit blue light, are disposed close to the light-emitting element 1D, which emits green light, it is possible to improve the color-mixing property between green light and blue light. Thus, according to the present embodiment, it is possible to improve the color-mixing property of the light-emitting device.

For example, an epoxy resin or a silicone resin having a good heat resistance and a good light resistance may be used as the base resin material of the resin portion 50. The resin portion 50 preferably contains a light-reflective member to reflect light from the light-emitting element 1D, the first light-emitting element 41, the second light-emitting element 42 and the third light-emitting element 43. For example, titanium oxide, aluminum oxide, silicon oxide, or the like, may be used as the light-reflective member.

For example, an epoxy resin or a silicone resin having a good heat resistance and a good light resistance may be used as the encapsulant 60. The encapsulant 60 may contain a phosphor. The phosphor may be one that emits red light whose peak wavelength is 580 nm or more and less than 680 nm, for example. The encapsulant 60 may contain a light-reflective member. For example, titanium oxide, aluminum oxide, silicon oxide, or the like, may be used as the light-reflective member.

While various embodiments of the light-emitting element and the light-emitting device according to the present invention have been described in detail above, the spirit and scope of the present invention shall not be limited thereto but be broadly interpreted based on the appended claims. It is understood that various changes and modifications based on these descriptions fall within the spirit and scope of the present invention.

What is claimed is:

1. A light-emitting element comprising:
a semiconductor stack having a triangular shape in a top plan view, the semiconductor stack comprising a first semiconductor layer of a first conductivity type, a second semiconductor layer of a second conductivity type, and an active layer located between the first semiconductor layer and the second semiconductor layer;
a first electrode located on the first semiconductor layer and comprising a first connecting portion and a first extension extending from the first connecting portion; and
a second electrode located on the second semiconductor layer and comprising a second connecting portion and a second extension extending from the second connecting portion, wherein:
the semiconductor stack comprises a first side, a second side continuous with the first side, and a third side connecting the first side and the second side;
the first extension comprises a first portion extending from the first connecting portion toward the second connecting portion; and
the second extension comprises:
a second portion comprising a portion extending along the first side, a third portion comprising a portion extending along the second side,
a fourth portion comprising a portion continuous with the second portion and extending along the third side,
a fifth portion comprising a portion continuous with the third portion and extending along the third side,
a sixth portion extending from the second portion toward the first electrode, the sixth portion including a curved section that curves such that the distance between the sixth portion and the second portion increases as the sixth portion approaches the first connecting portion, and
a seventh portion extending from the third portion toward the first electrode, the seventh portion including a curved section that curves such that the distance between the seventh portion and the third portion increases as the sixth portion approaches the first connecting portion.

2. The light-emitting element according to claim 1, wherein the first extension further comprises an eighth portion extending from the first connecting portion toward the second portion and a ninth portion extending from the first connecting portion toward the third portion.

3. The light-emitting element according to claim 2, wherein the eighth portion and the ninth portion each comprise a portion extending along the third side.

4. The light-emitting element according to claim 2, wherein the eighth portion and the ninth portion each comprise a portion inclined relative to the third side.

5. The light-emitting element according to claim 1, wherein the first electrode is surrounded by the second electrode in a top plan view.

6. The light-emitting element according to claim 1, wherein the first connecting portion and the second connecting portion are disposed on a virtual line that extends perpendicular to the third side.

7. The light-emitting element according to claim 1, wherein an end of the sixth portion and an end of the seventh portion point directly at the first connecting portion.

* * * * *